United States Patent [19]

Zhiwei

[11] Patent Number: 4,728,905
[45] Date of Patent: Mar. 1, 1988

[54] HIGH FREQUENCY, WIDE BAND, SUPERLINEAR INTEGRABLE AMPLIFIER AND ITS METHOD OF FABRICATION

[76] Inventor: Yu Zhiwei, No. 1,92th Lane Yongnian Road, Luwan District Shanghai, China

[21] Appl. No.: 846,210

[22] Filed: Mar. 31, 1986

[30] Foreign Application Priority Data

Apr. 1, 1985 [CN] China ................................. 85100523

[51] Int. Cl.$^4$ ............................................. H03F 1/34
[52] U.S. Cl. .................................... 330/293; 330/294; 330/306; 330/307; 330/310; 29/832; 29/836
[58] Field of Search .................. 330/85, 102, 103, 109, 330/289, 299, 293, 294, 306, 307, 310; 357/81; 29/831, 832, 835, 836

[56] References Cited

U.S. PATENT DOCUMENTS

| | | | |
|---|---|---|---|
| 3,373,369 | 3/1968 | Cones | 330/293 X |
| 3,473,136 | 10/1969 | Akiyama et al. | 330/293 |
| 4,172,261 | 10/1979 | Tsuzuki et al. | 357/81 |

FOREIGN PATENT DOCUMENTS

1244868  7/1967  Fed. Rep. of Germany ...... 330/293

OTHER PUBLICATIONS

Mollinga, "Designing DC Amplifiers, Part 1/Amplifiers with Zero Input and Ouptut Levels", EEE, Feb. 1969, pp. 46-51.

Primary Examiner—James B. Mullins
Attorney, Agent, or Firm—Oblon, Fisher, Spivak, McClelland & Maier

[57] ABSTRACT

An integrable, high frequency superlinear amplifier and its fabrication method is disclosed which is related to the basic amplifier fabrication field having negative feedback and signal conversion. The three stage amplifier design involves a first and second stage which have a narrow bandwidth response and a third amplifier stage with a larger or wider bandwidth response. The bandwidth of the wide bandwidth stage is such that when the gain curve for the two narrow bandwidth stages passes through the −6dB point at a first frequency then the peak point of the wide bandwidth stage is located at a second frequency higher than the first frequency. The wide bandwidth stage utilizes a single capacitor so that the resulting curve of the three stages has an approximately flat portion below the zero gain point. The impedance of the network is adjusted to a desired value through a feedback configuration.

5 Claims, 11 Drawing Figures

HIGH FREQUENCY, WIDE BAND, SUPERLINEAR INTEGRABLE AMPLIFIER AND ITS METHOD OF FABRICATION

BACKGROUND OF THE INVENTION

1. Field of the Invention

The present invention relates to an integrable, high frequency, wide bandwidth superlinear amplifier and the method of its fabrication. More specifically, the invention is addressed to a high frequency, wide bandwidth, high stability, low noise, high reliability and large negative feedback amplification system which is fabricated with a view toward improving the integration capabilities.

2. Discussion of Background

Prior art attempts to improve the performance of high frequency, wide bandwidth, superlinear amplifiers have generally dealt with the increase in feedback or deep feedback. This technique utilized in the prior art provides two serious problems. In a first instance the design for a high frequency and deep feedback amplifier has an increasing amount of complexity. For example, a line amplifier having a bandwidth of from 0.3 MHz to 9 MHz has more than 50 "K" correcting elements when the standard Bode method is utilized. Because of the large number of elements, it is not possible to make the parameters of the elements completely consistent with each other and it is also difficult to control any parasitic effects of the parameters. It is also a requirement of this type of structure to require precise elements and therefore for these reasons it is difficult to integrate an amplifier with high performance into an integrated circuit environment. The second serious problem with the application of deep feedback in order to provide better performance in a high frequency amplifier involves the need for reversed bias isolation in an integrated circuit environment. However, both isolation capacitance and parasitic inductance are very large which makes reverse bias isolation difficult. Therefore, the parasitic parameters are not easily and effectively controlled and an additional phase shift must be considered for use in a high frequency circuit.

The amplifiers discussed above with respect to the prior art are usually fabricated by discrete elements or hybrid integration with thick and thin film techniques. Thus, each amplifier must be carefully designed and adjusted, and the rate of the products which meet this specification in any particular batch is usually less than 10%. Thus it is very difficult to provide for mass fabrication and integration production. Also it is impossible to produce a series and a universal integrated amplifier which is of a high quality or to provide a simple design for such amplifier with high productivity which could be constructed by discrete elements.

If a high frequency (or low frequency) wide band superlinear amplifier could be constructed with simple design, a decreased number of correcting elements for the feedback, and increased stability with respect to independence from the transistor characteristics, a small amount of additional phase shift and less cost in an integrated circuity environment, there would be many applications with respect to amplification for analog signals as well as PAM (Pulse Amplitude Modulation), PCM (Pulse Code Modulation) signals, precise and high speed automation systems, communications systems, military and aerospace equipment as well as audio systems.

To this date there exists no high frequency wide band superlinear universal type integration products having a fabrication method which satisfies and overcomes each of the above disadvantages. U.S. Pat. Nos. 3,774,118; 3,530,392; 2,959,741; and 2,885,494 do not propose any simplified design method for the feedback in the nature of a $K\beta$ nor have they yielded any new methods of integration. Most particularly none of these references provide for a universal and serialized design and production utilizing discrete and integrated elements.

SUMMARY OF THE INVENTION

Accordingly it is a primary object of this invention to provide an amplifier arrangement and fabrication which simplifies the designs of circuits and presents a new fabrication method for integration in order to produce universal and serialized integrated circuits having the advantage of high frequency, wide bandwidth and superlinearity as well as high stability, low noise, high reliability and deep feedback (or low or weak feedback), which will be available for use in a wide variety of areas.

It is another object of the present invention to provide a system and a method of fabrication universal and serialized integrated products which overcomes the disadvantages in existing techniques with respect to adjustments and integration and which would possess many advantages if used in an audio system such as low modulation distortion, low transit distortion, negative feedback of 180° and which would utilize transistors having low characteristic frequencies.

It is a further object of the present invention to provide two types of circuit designs utilizing a two stage amplifier and a three stage amplifier which is based on the concept of a simplified circuit design with the number of correcting elements being greatly reduced from that of the prior art. The method of fabrication of these two types of circuit designs produces an amplifier which could function at approximately 10 GHz or as low as DC frequency. The technology of the method of the present invention utilizes a separation method in which the total of the feedback circuit length is approximately equal to the size of the silicon chip or smaller in order to reduce parasitic capacitance, the inductance of the ground wires and spacial inductance.

The objects of the present invention have been attained by providing for fabrication and design which utilizes the combination of "the two-narrow-one-wide method" or "two-wide-one-narrow method" combined with the "Bode" method. This combination provides a new method having the least number of correcting elements required and guarantees the implementation of the circuit design.

It is the further object of the present invention to provide a method whereby the combination of the "Bode" method, the "two-wide-one-narrow method" and the "two-narrow-one-wide method" may combine with the above mentioned integration techniques or with a control method for discrete elements in order to provide environments in which larger or deeper negative feedback is utilized whereby the specifications such as the harmonic distortion and the stability of the amplifier may be improved by the factor of $(1+K\beta)$, in dependence upon the feedback intensity.

It is also an object of the present invention to provide an amplifier which is basic and which can be cascaded for consecutive multi-stage multiplication.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
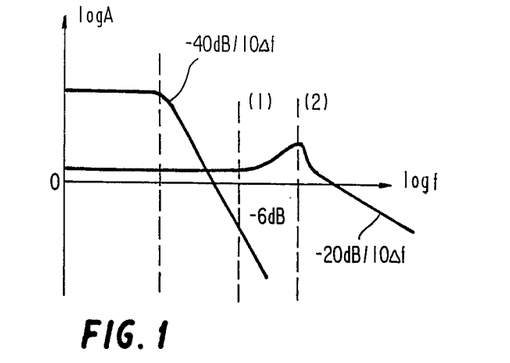
FIG. 1 illustrates the curves for the two-narrow-one-wide method for the two-narrow stage and the wide band stage respectively.
Figure 2:
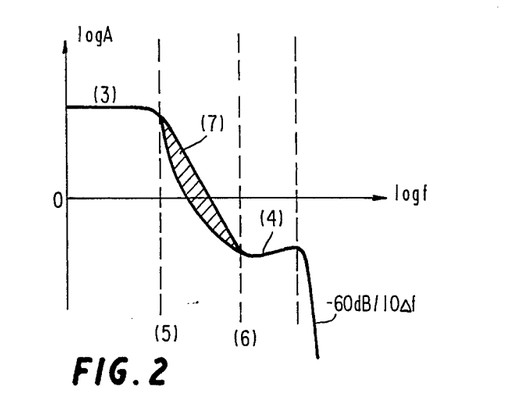
FIG. 2 is a representation of the two-narrow-one-wide method resulting from the combination of the curves of FIG. 1.
Figure 3:
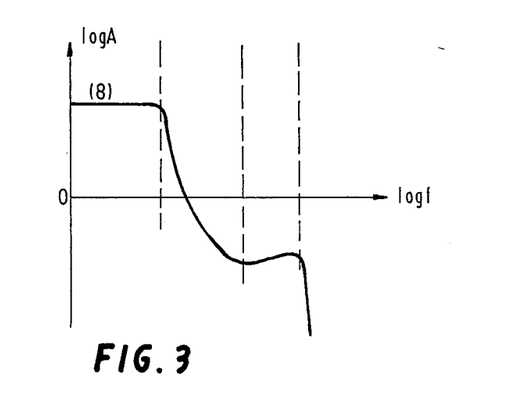
FIG. 3 is a Bode method approximation diagram representing a phase shift curve.

Referring now to the drawings, wherein like reference numerals designate identical or corresponding parts throughout the several views and more particularly to the FIGS. 1-3 thereof, there is illustrated a design for a three-stage type amplifier structure which is illustrated as a combination of a method which uses two narrow bandwidth amplifier stages and one wide band width amplifier stage as illustrated in the FIG. 1 which shows the gain curve for two narrow band width stages passing through the frequency 0 point to the 6 dB point as shown in FIG. 1 marked (1). The peak point, as shown in FIG. 1(2), of the enhancing curve for the wide band width stage is at a higher frequency than the frequency (1). Thus, the resulting curve of the three stages which is shown in FIG. 2(3) is, below the 0 point, a curve which is approximately flat as indicated in FIG. 2(4). In the next phase, the shadowed section shown in FIG. 2(7) by the dashed lines must be removed from the $-40$ dB/10 f descending slope as indicated between (5) and (6) in FIG. 2. In the practice of an actual implementation which will be discussed in conjunction with the figures, a RLC network is utilized to "absorb" the "dashed area section".

Figure 4:
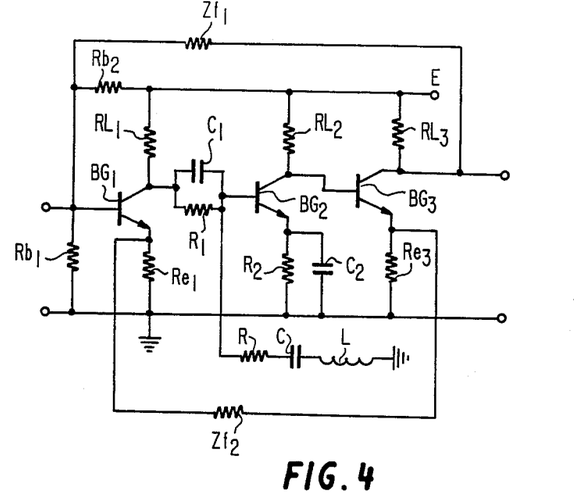
FIG. 4 is a schematic diagram of a three-stage configuration of an amplifier according to the present invention.
Figure 5:
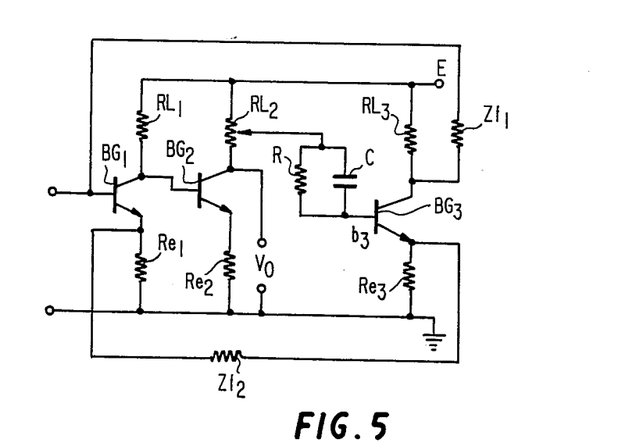
FIG. 5 is a modification of the three-stage configuration of FIG. 4.

The portion of the enhancing curve of the enhancement method, referred to as the single capacitor method, is implemented as shown in FIG. 4 utilizing $R_1C_1$ and $R_2C_2$ and in the embodiment of FIG. 5 by utilization of RC. Utilizing these two steps of the narrow band width stages and the enhancing curve, the resulting three-stage curve of FIG. 2 including the dashed-out section, approaches the least Bode phase shift curve as shown in FIG. 3(8). More precise corrections or greater (deeper) feedback is available by utilizing more correcting elements which can be incorporated into FIG. 4 and into FIG. 5 according to the Bode analysis method. The greater the number of correcting elements according to the Bode method, of course, the closer the curve will approach the ideal curve. For example, the frequency (5) in FIG. 2 is enhanced to be a prominent point by utilizing RLC serial enhancement networks and other frequencies in FIG. 2 over and above the showing of the frequency at (6) can be enhanced with a single capacitor correcting or RLC enhancement network.

It must be noted however that if the bandwidth of the wide band stage is sufficiently large and if the parasitic parameters are controlled, the further precise correction is not required and only $R_1C_1$ or $R_2C_2$ are needed. It should also be considered whether it is necessary to remove the dash area section in FIG. 2(7) by RLC. If these values are not used, then the circuit becomes the same one as designated by the method of the two-narrow-one-wide or the two-wide-one-narrow method. The wide bandwidth stage can be designed at any one of the stages. If $R_2C_2$ are utilized to increase the bandwidth, the increasing coefficient of the bandwidth is $(1+K\beta)$.

In order to provide the above purposes, calculated and experimental curves are usually plotted in a double logrithm plotting paper during the design and the frequency (2) for wide-bandwidth stage and the dB increment at (2) are then determined. The increment at frequency (2) is usually 3–26 dB. The greater the increment the less the phase shift at (1) with the amplitude of the increment being determined by $R_1C_1$ or $R_2C_2$ in FIG. 4. The items $Z_{f1}$, $Z_{f2}$ provide current and voltage feedback and provide for adjustment of the impedance to the desired value in such a manner that the feedback utilizing three stages only absorbs a small input and output signal which is desirable for low noise and low distortion. The highest frequency of the transistor equal to $0.9f_T$ can be employed utilizing this design.

The FIG. 5 illustrates the modified three-stage type construction whereby the wide bandwidth stage of the three-stage device which is utilized for enhancing and widening the frequency range is provided at the third stage and is provided if the output is connected to the collector for the second stage. This particular stage is utilized especially for negative feedback conversion and its feedback intensity is determined by $R_{e3}$ and $R_{L3}$ or by the different tapped points at $R_{L2}$. However, $R_{e3}$ mainly specifies the bandwidth of the transistor $BG_3$ with the peak point of enhancement (2) from FIG. 1 being determined by RC in FIG. 5. The particular aspect of this method is that it allows for the making of the bandwidth of the wide bandwidth stage in such a way that it reaches it maximum value. This is due to the fact that the third stage is a feedback attentuation stage and that larger values of $R_{e3}$ can be utilized. According to the feedback of this particular stage, the bandwidth increases to a factor of $(1+K\beta)$. For example, frequency (2) can reach up to $(0.5-1.0)f_T$. If $f_T$ increases, the frequency (2) of FIG. 1 can also increase. This modified three-stage type construction has the advantage in that the operating frequency is higher than for the three-stage type shown in FIG. 4 in that it can reach approximately $1f_T$ . Either of these stages provide for a better gain, feedback, noise figure and harmonic distortion.

Figure 6:
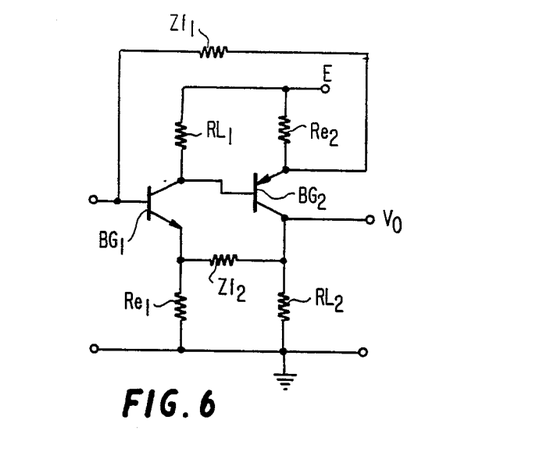
FIG. 6 is a two-stage configuration for an amplifier according to the present invention.

The embodiment of FIG. 6 utilizes a two-stage type design structure whereby such design overcomes the prior art shortcomings of two-stage type structures. That is, normally in a two-stage type construction the impedances cannot be adjusted, the open loop gain is low and the noise figure and harmonic distortion are poor. According to the presently disclosed invention as shown in FIG. 6, the NPN and the PNP transistors are mixed together and both current and voltage feedback are used. The feedback points for $Z_{f1}$, $Z_{f2}$ can be moved to the $R_{e2}R_{L2}$ taps to adjust the required output and input impedances. In some instances, $Z_{f2}$ can be cancelled and shorted out and $R_{e1}$ and $R_{L2}$ are merged into one resistance. This "one" resistance specifies the current-series feedback. Thus, this improves the open-loop gain, noise figure and harmonic distortion. Its limitations are that the specifications, such as gains, etc. are not as good as three-stage type and modified three-stage type. Because of the influences of $R_{e1}R_2$ existing in the open loop which are larger than in the three-stage embodiment and the modified three-stage embodiment, the gain is lower than in the circuits of FIGS. 4 and 5. However it is an improved two-stage modification over any of the other prior art two-stage structures.

Each of the three design concepts embodied by the FIGS. 4-6 introduce noise which is less than 0.5-6 dB and are able to adjust impedances. Even without transformers, all of the above designs of FIGS. 4-6 provide excellent performance which is very important in order to obtain integration and miniaturization.

If the peak point is enhanced by 3-26 dB width RC at the frequency (5) in FIG. 2, the phase shift can be controlled to be within approximately $-180°$ in the bandwidth used and any additional phase shift being in the range of 0° to 5°. Because music wave forms include high-order harmonics, and the loudspeakers reverse electromotive forces and burst stopping voltages also have high frequency components, the amplifier constructed in this manner can insure approximately 180° negative feedback with 0° to 5° additional phase shift for these high frequency components. Thus, the present invention provides an improvement in the variety of instantaneous characteristics while using transistors requiring lower $f_T$ than those of conventional designs. Therefore, a lower cost results and it is to be emphasized that this design and method can be applied to two-stage, three-stage and other multi-stage circuits.

Figure 8:
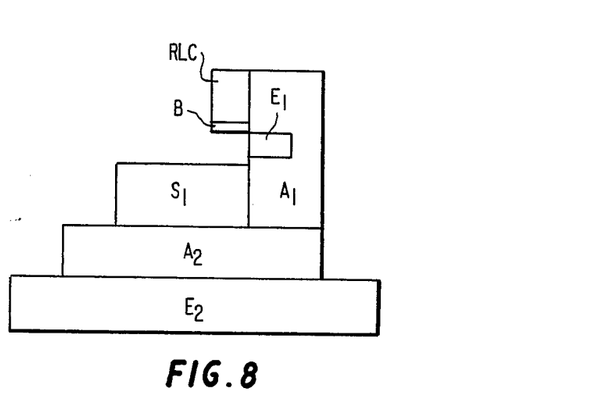
FIG. 8 is a schematic diagram for hybrid integrated film fabrication with a silicon chip separated as illustrated in FIG. 7.

Utilizing the above analysis, several configurations for integrated circuits have been devised as illustrated in FIG. 8. This configuration insures that all the connecting wire length for the electrodes are within 0.01-0.5 mm. The wire length from an emitter must be as short as possible in order to avoid additional phase shift. The sharp edges of the ground wire $E_1$ reduce inductance from the ground wire on the silicon chip. If there is no direct ground, then the sharp edge contacts may be omitted. In the meantime, the height for $E_1$ is reduced. Furthermore it can be used to reduce the length of the connecting wire if there is no direct ground. The ceramic heat sink is indicated at $A_2$ and $A_1$ indicates the ceramic substrate for fabricating the ground wire $E_1$ and the film R, L, C. In order to be as close as possible to other silicon chips, R, L, C should be at the top upper portion of $A_1$. The substrate $A_1$, the ground wire $E_1$ and R, L, C are glued together, situated on $A_1$ and prefabricated separately with all of them adhered to the heat sink $A_2$. The soldering point is illustrated at B for the R, L, C utilizing silver coating. The thickness of $E_1$ and its distance from the silicon chip influence the length of all connecting wires and the parasitic capacitances which result between ground and the silicon chips.

In order to reduce the inductance of the ground wire $E_1$ should be made thinner and wider. For example, $E_1$ should have a thickness of 0.01-0.02 mm and a width of 1-6 mm. Thus, the ground wire inductance is less than conventional integrated circuits and the parasitic capacitors are also subsequently small. The silicon chip is square or rectangular in shape and after being fabricated on the whole circular chip successfully, a small portion is cut off from the chip. R, L, C may be integrated and fabricated first before they are soldered on the heat sink $A_2$. At a later stage the transistors and the R, L, C are separated so that individual parasitic parameters are obtained having a minimum distance so that this fabrication utilizes the advantages of integration techniques. Because the size of the silicon chip depends on the size of the transistors, the total length of the loop may be controlled to be less than 0.1-10 mm which is less than or approximately equal to the size of the silicon chip. If inductionless capacitors are used, the virtual total length is much shorter. In the instance of specialized requirements or general purpose needs, the manufacturer may simply leave room for the R, L, and C where customers may put various film-elements on the top of the integrated circuits themselves or they may ask the manufacturer to fabricate a custom design. Manufacturers may develop a variety of RLC chip elements and publish products manuals to speed the applications. The above integrated circuits with each parasitic capacitor of less than 0.01-50 pf can be fabricated together in a first step and then in a second step separated (FIG. 7) In order to reduce parasitic capacitances, holes may be punched on $E_2$.

Utilizing the above design concepts, each transistor has optimal independent parasitic parameters and its fabrication utilizes integration techniques. Thus, this is especially suitable for mass production and drawbacks, which occurred in conventional integrated circuits such as reverse-bias isolation capacitance and other large parasitic parameters, are eliminated. Because of the preciseness and the speed of current soldering techniques, the design of this invention insures precise geometrical sizes. In order to improve reliability, the defective sections in any chips may be removed by a computer-controlled location detection method.

Figure 9:
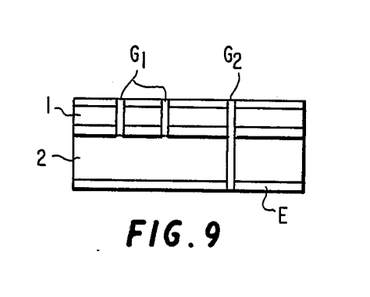
FIG. 9 is a schematic diagram illustrating three layers separating two separate fiberboard layers.

In a further aspect according to the present invention, the amplifier may be constructed with discrete elements in a fabrication system to be disclosed. This is to be utilized if integrated techniques are not available and provides for a simple and easy method to employ the design of the present invention. The performances of this concept in the embodiment of discrete elements also provides an improvement over the currently known techniques for discrete element design. In a first example, threelayer printed circuit boards are used as illustrated in FIG. 9. It is also noted that two-layer printed circuit boards may also be utilized. The upper and lower layers are made of copper foil with $G_1$ representing a metallized hole, which prevents solder elements from pulling out. The third layer mainly serves as a ground wire. If grounding is needed it must be connected to the large area ground wire on the third layer. However, the first fiberboard should be thin and all interconnections should be made on the first layer. A few wires may be laid on the second layer, but the circular soldering joint should be small and the second fiberboard is purposely made thick in order to make parasitic capacitances small enough and the ground inductance also of a small enough value. If the requirement for tensile strength is not a serious factor, a two-layer board can be used.

Figure 10:
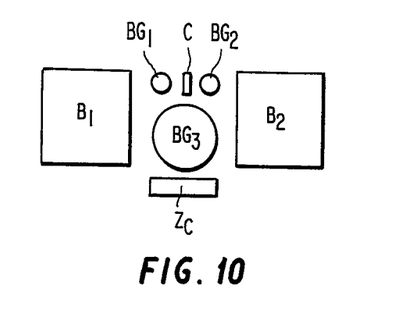
FIG. 10 is a diagram illustrating the layout of discrete devices.

The arrangement of the elements are shown in FIG. 10. Transistors, emitter capacitance and feedback capacitors which have influence on the A.C. loop length, are laid between two transformers B1, B2 where the interval between the two transformers is approximately from 3–20 mm and all other resistances are laid outside the transformer. Thus the total loop length is controlled within a length of 10-65 mm. Ground wires are considered to be an inductionless ground wire and thus it can eliminate any additional phase shift which is a very important consideration Multiple-wires of 0.05–0.3 mm each are wound in parallel and interleaved. All layers are interlaced with each other to obtain small parasitic capacitance and leakage inductance in the transformers.

Descriptions will now be given with respect to implementation of specific embodiments for the design concepts discussed above.

When the circuits of the present invention are designed to operate at several GHz, the resistances are limited to be within 1K ohms and most of them are limited to 10-500 ohms except those bias resistances with less influence on the AC parameters. As an example the FIG. 4 provides a structure having an operating frequency at 1 GHz and a $f_T$ for three transistors being equal to 4 GHz. The second stage is such that $K_i$ equals up to 0.5 whereas the original $K_i$ equals 4. Thus, $(1+K\beta)=4/0.5=8$, i.e., the bandwidth increases up to a factor of 8 reaching to approximately 16-20 GHz. Proceeding to the logarithmic gain curves, the two-narrow stages have descending rates at −40 dB and 0 dB corresponding to 4.4 GHz. The −6 dB corresponds to 5.6 GHz; −10 dB corresponds to 40 GHz; −20 dB corresponds to 70 GHz. It can be demonstrated that if the extent of the feedback safeguarding is 6 dB, 5.6 GHz wideband stage approaches the requirements for such a design. Therefore $(1+K\beta)=(30-28)/20=1.5$ for the wideband stage is sufficient. In order to insure stability the bandwidth for the second stage is devised to be 80 GHz so that then the value of $1+K\beta=4$ and thus $K_i$ for the second stage=21. Also, of course, the enhancing peak is set at 80 GHz which is illustrated at [2] in FIG. 1. When $R_e=R_L=50$, $K_v=24$ dB, the feedback at high frequencies is 7 dB and the feedback at low frequencies is 35 dB, $b_{20}=50$ dB, $b_{30}=70$ dB for the transistors. When the flat gain=17 dB for the amplifier, then $b_{20}=85$ dB and $b_{30}=105$ dB at low frequencies and $b_{20}=57$ dB, $b_{30}=77$ dB at high frequencies.

In the FIG. 5 embodiment, because the third stage serves as a wideband stage and may have a negative gain, the bandwidth can be made very large. The emitter of the second stage may be directly grounded and thus the total feedback is larger than the circuit of FIG. 4 and it may operate in FIG. 5 at higher frequencies.

When the circuit of FIG. 6 is utilized, because of the resistances of $R_{e1}$, $R_{L2}$ and $R_{e2}$ the open loop gain is lower and the feedback is limited. In the construction of FIG. 6 $K_{vf}=8$ dB, $b_{20}=60$ dB, $b_{30}=80$ dB at low frequencies. For these reasons, it has been recommended previously that three-stage configurations be utilized.

With respect to the gain adjustement of these embodiments, it is controlled by $Z_{f1}$, $Z_{f2}$. If a higher gain is needed, muti-stage cascade multiplication with the configurations of FIGS. 4–6 as a basic stage is utilized. Under high frequencies $K_v$ gain can reach to approximately 10–20 dB which is considered to be a very large value. An example of a high frequency is 10 GHz.

Figure 7:
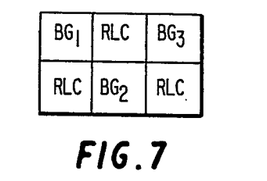
FIG. 7 is a schematic diagram illustrating the integrated separation method.

The fabrication by the integration separation methods previously discussed with respect to FIGS. 1–6 is shown in FIG. 7 and in FIG. 8 wherein the loop length is 1.5 mm and the introduced $C_{ob}$ is less than 0.1 pf. The methods of FIG. 7 and of FIG. 8 can be combined for purposes of fabrication. For example, RLC in FIG. 7 is fabricated by thick and thin film methods and $S_i$ in FIG. 8 may employ separation configuration shown in FIG. 7.

Figure 11:
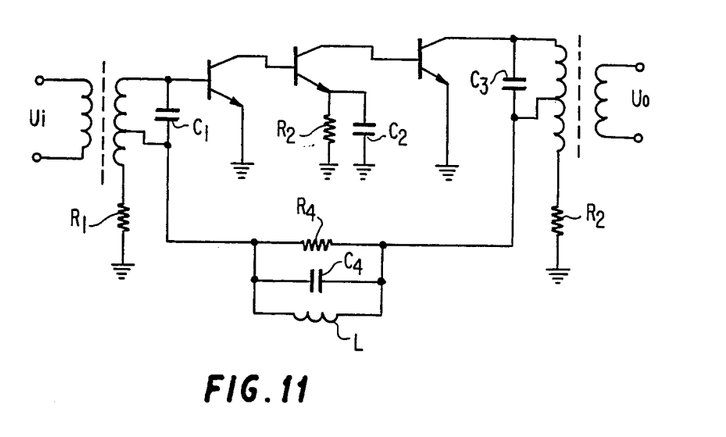
FIG. 11 is a schematic diagram for an amplifier having transformers and discrete elements.

The circuit of FIG. 11 is such that the $R_2$ and $C_2$ are used to enhance the peak for the wideband stage, previously discussed, whose bandwidth is 0.08 MHz-5 MHz and whose high frequency gain is 44 dB. The extent of the feedback is 45 dB at low frequency and 14 dB at high frequencies. At low frequency $b_{20}$ is 80 dB, $b_{30}$ is 105 dB and at high frequencies $b_{20}$ is 80 dB, $b_{30}$ is 94 dB. This satisfies the linearity requirements and provides an impedance of 75 ohms. The reflection attentuation in the full bandwidth is less than 27 dB. In the example of the layout shown in FIG. 10 the distance between the two transformers is 12 mm and the transistors as well as $C_2$ and $C_4$ from FIG. 11 would be laid between the transformers and any other elements independent of the loop length are all laid outside of the transformers. Because one of the three layers has ground wires of a large area which are inductionless, the total loop length is limited within 35 mm to reduce the effect of additional phase shifts. Transformers are wound in parallel and doubleline interleaved with each layer being parallel connected by 0.05-0.3 mm wires. The parasitic capacitances are less than 10 pf and the leakage inductance is less than 0.1% to guarantee stable edges. The pass band characteristics are insured by $R_4$, $C_4$, L and if R is substituted for $R_4$, $C_4$, L, the gain curve becomes flat. In this example the gain curve is slightly slanted with 26 dB at low frequencies and 44 dB at high frequencies.

The design and the fabrication according to the present invention provides an extremely simplified $K\beta$ design wherein the number of correcting elements is greatly reduced and there is no requirement for precise elements. The design and the fabrication is convenient and it is designed in order to exploit integrated techniques. Other beneficial effects include the fact that the parasitic parameters can be controlled and that the process technology is simple. Because of this simplified design, a small number of elements and because of the integration it is possible to produce serialized, universal and low cost integrated products or discrete products used in various fields. The resultant products will have excellent characteristics such as high frequency, wide band width, superlinearity, high stability, high reliability, low noise, antigravitation integraton and adjustable impedance utilizing no transformers.

If a lower frequency is used, the circuit design of the present invention can be combined with conventional integrated circuit process techniques or conventional design can be combined with the separation method of the present invention and the integrated techniques may then be employed.

Because of these various advantages the amplifier constructed according to the present invention may be applied to the following systems.

It may be used to amplify impulse digital signals so that various characteristics, such as low noise, adjustable impedance and high frequency are obtained. This adjustable impedance may especially improve the reflecting and standing wave characteristics. If switch control circuits are inserted to the feedback loop or input and output terminals, analog signals may be converted into PAM signals. Because the amplifier can operate at high frequency, it can also serve as a fast processing means for other digital circuits.

If the present invention is utilized in products having high precision requirements such as instruments, automation control, military and aerospace technology, then various advantages of the amplifier such as integration, miniaturization, antigravitation, high frequency, wide band width, superlinearity, high stability, low noise and adjustable impedance without transformers are in the forefront of these type of devices utilized in the present invention.

When the amplifier is utilized in conjunction with analog operation and active filters the characteristics which are important include the low noise and high frequency ability.

When the present invention is utilized for emitting and receiving equipment in broadcasting radio and television, the superlinearity is used to reduce distortion problems. Additionally, no matter how AGC (automatic gain control) voltages change, the pass band characteristics remain constant in the AGC adjustment for fixed impedance. Thus, the present invention can improve performance of various emitters, receivers, televisions and radio receiver circuits. This is true because the amplifier directly changes the gain by controlling the magnitude of the feedback impedance. In the meantime the introduced noise figure is less than 3 dB.

When applied to audio systems, such as receivers, amplifiers, tape recorders, etc. for domestic and professional equipment, the low cost and the other characteristics with respect to intermodulation distortion become important. That is, because of the lower $f_T$ and because of the use of linear transistors in order to obtain low harmonic distortion, it is also reliable for providing intermodulation distortion which is of a low value as well as instantaneous distortions. If the present invention is operated in the range of 0.1–0.6 for a prominent peak frequency, only 0°–10° of additional phase shift are introduced by raising the peak [5] of FIG. 2 outside the pass band to 3-26 dB. This insures approximately 180° negative feedback for audio-high frequencies and demonstrates a very fast response time. Even for burst stopping music waveforms and loudspeaker reverse electromotive forces, which have right high frequency components, they can be sufficiently suppressed. Thus, not only circuit problems but also matching problems between loudspeakers and amplifier interfaces are solved by the present invention while lowering the requirements for the precision of the transistors.

Communication systems are also capable of being improved utilizing the present invention because the amplifiers of the present invention have excellent linearity and impedance adjustability with no transformers. Thus more than 90 percent of the transformers may be eliminated in voice terminals and line terminals bays. The devices or modulators are available from the present market and the carrier distribution and concentration all employ active distributors. Any characteristic required such as constant current output (high impedance), low resistance concentration, etc. which improve concentration accuracy and reflection performance can be obtained. In order to reduce the volume, a single crystal chip filter may be used. Thus the amplifier is required to function at approximately 10 MHz. However, simple and high frequency performance of the present amplifier easily meets those requirements. FET's of $V_{gs}$ of 1200 volts are used in balanced inputs and high-voltage transistors or high-power and high-voltage FETs are employed in balance outputs. Integrated circuits are divided into blocks according to the bays.

Application of the present invention to optical fiber systems provides improved integration, low noise and low cost as well as improves the simplicity of the reconstruction. This is especially true in optical fiber analog systems where the characteristics of the simplicity, effectiveness and superlinearity as well as high frequency are evident.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by letters patent of the United States is:

1. A three stage amplifier network comprising:
   a first transistor stage and a second transistor stage of said three stages having narrow bandwidth response wherein each of said first and second transistor stages have associated therewith a first resistance $R_L$ connected to the respective collectors and a second resistance $R_e$ connected to the respective emitters;
   a third transistor amplifier stage having a bandwidth larger than said two narrow bandwidth transistor stages wherein said larger bandwidth of said third transistor stage is accomplished by at least one RC network;
   wherein the wide bandwidth of said wide bandwidth amplifier stage is such that when the gain curve for said two narrow bandwidth stages passes through the −6 dB point at a first frequency then the peak point of the wide bandwidth of said wide bandwidth stage amplifier section is located at a second frequency which is greater than said first frequency and wherein said wide bandwidth stage utilizes said at least one RC network whereby the resulting curve of said three stages has an approximately flat portion below the zero gain point;
   wherein said third stage is said wide band width stage and wherein the output of said network is connected to said second stage whereby the band width of said wide band width third stage is at a maximum value and wherein said third stage is a feedback attenuation stage.

2. A method of fabricating a three-stage integrated circuit comprising the steps of:
   providing a heat dissipation plate $E_2$ containing thereon a ceramic heat sink;
   fabricating a whole silicon chip containing a plurality of transistors;
   providing a ceramic substrate wherein said ceramic substrate is used for fabricating a ground wire $E_1$ and a film RLC;

gluing said ground wire $E_1$, said RLC and said ceramic substrate together;

adhering said glued together ceramic substrate, ground wire film RLC and said silicon chip to said ceramic heat sink $A_2$ wherein the value of the parasitic capacitance of said integrated circuit and the length of connecting wires utilized is proportional to the thickness of said ground wire and the distance from said ground wire to said silicon chip.

3. The method according to claim 2 further comprising the step of punching holes in said heat dissipation plate $E_2$ in order to reduce parasitic capacitance.

4. The method according to claim 2 comprising the step of forming said ground wire $E_1$ with sharp edges for reducing inductance between said ground wire and said silicon chip.

5. A three stage amplifier network comprising:

a first transistor stage and a second transistor stage of said three stages having narrow bandwidth response wherein each of said first and second transistor stages have associated therewith a first resistance $R_L$ connected to the respective collectors and a second resistance $R_e$ connected to the respective emitters;

a third transistor amplifier stage having a bandwidth larger than said two narrow bandwidth transistor stages wherein said larger bandwidth of said third transistor stage is accomplished by at least one RC network;

wherein the wide bandwidth of said wide bandwidth amplifier stage is such that when the gain curve for said two narrow bandwidth stages passes through the $-6$ dB point at a first frequency then the peak point of the wide bandwidth of said wide bandwidth stage amplifier section is located at a second frequency which is greater than said first frequency and wherein said wide bandwidth stage utilizes said at least one RC network whereby the resulting curve of said three stages has an approximately flat portion below the zero gain point; and at least one resistor-inductor-capacitor circuit forming a means for modifying said resulting curve of said three stages wherein said modification resultng from said modifying means network operates on the portion of said resulting curve which has a slope of minus 40dB/10 f and wherein said amplifier network further includes at least one feedback means for adjusting the impedance of said network to a desired value.

* * * * *